United States Patent
Shiiki et al.

(10) Patent No.: US 6,376,896 B1
(45) Date of Patent: Apr. 23, 2002

(54) SEMICONDUCTOR DEVICE HAVING THIN FILM RESISTOR AND METHOD OF MANUFACTURING THE SAME

(75) Inventors: Mika Shiiki; Jun Osanai, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/323,506

(22) Filed: Jun. 1, 1999

(51) Int. Cl.[7] .............................................. H01L 29/00

(52) U.S. Cl. ...................................... 257/538; 257/536

(58) Field of Search ................................ 257/538, 536

(56) References Cited

U.S. PATENT DOCUMENTS

| | | | | |
|---|---|---|---|---|
| 4,210,996 A | * | 7/1980 | Amemiya et al. | 257/538 |
| 4,496,935 A | * | 1/1985 | Inoue et al. | 340/347 |
| 5,128,731 A | * | 7/1992 | Lien et al. | 257/401 |
| 5,235,312 A | * | 8/1993 | Sandhu et al. | 338/307 |
| 5,554,873 A | * | 9/1996 | Erdeljac et al. | 257/538 |
| 5,554,989 A | * | 9/1996 | Kumamoto et al. | 341/159 |
| 5,666,007 A | * | 9/1997 | Chung | 257/751 |

* cited by examiner

Primary Examiner—Sara Crane
(74) Attorney, Agent, or Firm—Adams & Wilks

(57) ABSTRACT

A semiconductor device comprises a ladder resistor circuit formed of a polycrystal silicon film having a thickness of 500–1500 Å and a sheet resistance of 1–5 kΩ/□. The polycrystal silicon film is doped only with p-type impurities.

5 Claims, 9 Drawing Sheets

SEMICONDUCTOR DEVICE HAVING THIN FILM RESISTOR AND METHOD OF MANUFACTURING THE SAME

BACKGROUND OF THE INVENTION

The present invention relates to a semiconductor device and, in particular, to a semiconductor device having a ladder resistor circuit using a polycrystal silicon resistor and to a method of manufacturing such semiconductor device.

Up to now, a ladder resistor circuit using a polycrystal silicon resistor into which n-type impurities are introduced has been widely employed, but in order to obtain a ladder resistor circuit which has small divided voltage output error and high accuracy, the polycrystal silicon resistor of which is lengthened in length has been known.

However, the conventional ladder resistor circuit using the n-type polycrystal silicon resistor suffers from such a problem that an area occupied by the ladder resistor circuit is caused to increase because the circuit uses a means for lengthening length of the resistor for the purpose of reducing the divided voltage output error.

The present invention has an object to provide a ladder resistor circuit which has small divided voltage output error and high accuracy which are not allowed by the conventional ladder resistor circuit using the n-type polycrystal silicon resistor, with a small occupied area.

SUMMARY OF THE INVENTION

The main means applied by the semiconductor device according to the present invention in order to achieve the above-mentioned object is as follows.

(1) The impurities introduced into a polycrystal silicon resistor in a ladder resistor circuit using a polycrystal silicon resistor are of p-type.

(2) The p-type impurities introduced into the polycrystal silicon resistor are $BF_2$.

(3) The p-type impurities introduced into the p-type polycrystal silicon resistor are boron.

(4) Two or more kinds of impurities are introduced in the p-type polycrystal silicon resistor.

(5) The structure is characterized in that the film thickness of the p-type polycrystal silicon resistor is from 500 to 1500 Å.

(6) The semiconductor device is characterized in that the sheet resistance of the p-type polycrystal silicon resistor is from 1 kΩ/□ to 25 kΩ/□.

(7) The semiconductor device is characterized in that the temperature coefficient of the p-type polycrystal silicon resistor is −4000 ppm/° C. or lower.

(8) The semiconductor device is characterized in that the length of the p-type polycrystal silicon resistor is from 10 μm to 150 μm.

(9) There is provided a method of manufacturing a semiconductor device, comprising the steps of: forming an oxide film on a semiconductor substrate; forming a polycrystal silicon film of 500 Å to 1500 Å in film thickness on the oxide film; doping the polycrystal silicon film region with p-type impurities; forming a region of the polycrystal silicon film by etching the polycrystal silicon film; doping a part of the polycrystal silicon film by $1\times10^{15}$ to $5\times10^{16}$ atom/cm$^2$; forming an intermediate insulation film on the oxide film and the polycrystal silicon film; defining contact holes in the polycrystal silicon film and the intermediate insulation film on the semiconductor substrate; and providing metal wirings in the contact holes.

(10) There is provided a method of manufacturing a semiconductor device, comprising the steps of: forming an oxide film on a semiconductor substrate; forming a first polycrystal silicon film on the oxide film; doping the first polycrystal silicon film region with impurities; forming a region of the first polycrystal silicon film by etching the first polycrystal silicon film; forming an insulation film on the surface of the semiconductor substrate including the upper portion of the first polycrystal silicon film region; forming a second polycrystal silicon film of 500 Å to 1500 Å in film thickness on the insulation film; doping the second polycrystal silicon film with p-type impurities by $1\times10^{14}$ to $1\times10^{15}$ atom/cm$^2$; forming a region of the second polycrystal silicon film by etching the second polycrystal silicon film; doping a part of the region of the second polycrystal silicon film by $1\times10^{15}$ to $5\times10^{16}$ atom/cm$^2$; forming an intermediate insulation film on the oxide film and the second polycrystal silicon film; defining contact holes in the first polycrystal silicon film, the second polycrystal silicon film and the intermediate insulation film on the semiconductor substrate; and providing metal wirings in the contact holes.

(11) The structure is characterized in that the insulation film comprises an oxide film of 300 Å to 1000 Å in film thickness.

(12) The insulation film comprises a laminated structure comprised of a thermal oxide film of 300 Å to 700 Å in film thickness, a nitride film of 200 Å to 1000 Å in film thickness and a thermal oxide film of 100 Å or less in film thickness.

(13) The p-type impurities with which the region of the second polycrystal silicon film is partially doped and the p-type impurities with which a diffused region of a MOS transistor having the p-type diffused region are introduced simultaneously.

(14) A method of manufacturing a semiconductor device, comprising the steps of: forming an oxide film on a semiconductor substrate; forming a first polycrystal silicon film on the oxide film; doping the first polycrystal silicon film region with impurities; forming a region of the first polycrystal silicon film by etching the first polycrystal silicon film; forming an insulation film on the surface of the semiconductor substrate including the upper portion of the first polycrystal silicon film region; forming a second polycrystal silicon film of 500 Å to 1500 Å in film thickness on the insulation film; doping the second polycrystal silicon film with p-type impurities by $1\times10^{14}$ to $1\times10^{15}$ atom/cm$^2$; forming a region of the second polycrystal silicon film by etching the second polycrystal silicon film; doping the second polycrystal silicon film structuring an n-type polycrystal silicon resistor with n-type impurities by $1\times10^{15}$ to $5\times10^{16}$ atom/cm$^2$; doping a part of the region of the second polycrystal silicon film structuring a high resistant element and a capacitor electrode and the second polycrystal silicon film structuring a low resistant element with p-type impurities by $1\times10^{15}$ to $5\times10^{16}$ atom/cm$^2$; forming an intermediate insulation film on the insulation film and the second polycrystal silicon film; defining contact holes in the first polycrystal silicon film, the second polycrystal silicon film and the intermediate insulation film on the semiconductor substrate; and providing metal wirings in the contact holes.

(15) The method of manufacturing a semiconductor device is characterized in that the n-type impurities with which the polycrystal silicon film region is doped are phosphorus.

(16) The method of manufacturing a semiconductor device is characterized in that the n-type impurities with which the polycrystal silicon film region is doped are arsenic.

(17) The method of manufacturing a semiconductor device is characterized in that the p-type impurities with which a part of the region of the second polycrystal silicon film structuring the high resistant element and the second polycrystal silicon film structuring the low resistant element are doped and the p-type impurities with which the diffused region of the MOS transistor having the p-type diffused region is doped are introduced simultaneously.

(18) The method of manufacturing a semiconductor device is characterized in that the n-type impurities with which the region of the second polycrystal silicon film structuring the n-type polycrystal silicon resistor and the n-type impurities with which the diffused region of the MOS transistor having the n-type diffused region is doped are introduced simultaneously.

DETAILED DESCRIPTION OF THE PREFERRED EMBODIMENT

The semiconductor device according to the present invention can realize a ladder resistor circuit small in occupied area, small in divided voltage output error and high in accuracy by use of a polycrystal silicon resistor into which p-type impurities are introduced (hereinafter referred to as a p-type polycrystal silicon resistor).

Hereinafter, a preferred embodiment of the present invention will be described with reference to the drawings.

Figure 1:
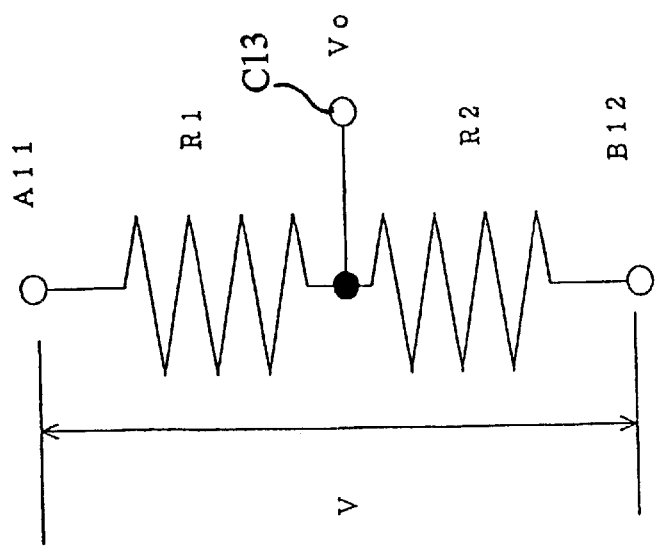
FIG. 1 is a circuit diagram showing a ladder resistor circuit in accordance with one embodiment of the semiconductor device of the present invention.

FIG. 1 is a circuit diagram showing a ladder resistor circuit in accordance with one embodiment of the semiconductor device of the present invention.

A voltage V applied between a terminal A11 and a terminal B12 is divided by a resistor R1 and a resistor R2 to obtain a divided voltage $V_0$ from a terminal C13. The divided voltage $V_0$ is represented by the following expression.

$$V_0 = (R2/R1+R2)*V \quad (1)$$

It is assumed that the divided voltage $V_0$ in the expression (1) is a theoretical value, and a difference between the theoretical value and an actual value is a divided voltage output error. The divided voltage output error is represented by the following expression.

Divided voltage output error=((|theoretical value $V_0$−actual value $V_0$|)/theoretical value $V_0$)*100 (2)

Here, that the divided voltage output error can be made small by changing the impurities introduced into the polycrystal silicon resistor from the n-type to the p-type will be described on the basis of data.

The characteristic required for the polycrystal silicon resistor that constitutes the ladder circuit is that the divided voltage output error of the ladder circuit is small and the integrated area is also small. In general, when the polycrystal silicon film is thinned, because the variation in the concentration of the low-concentration impurities is reduced, the divided voltage output error of the ladder circuit becomes small, thereby being capable of producing a ladder circuit high in accuracy. However, even if the polycrystal silicon film is thinned, if the length of the polycrystal silicon resistor into which the impurities are introduced (hereinafter referred to as an n-type polycrystal silicon resistor) is shortened, the divided voltage output error is caused to increase, thereby making it difficult to reduce the integrated area. However, if the p-type polycrystal silicon resistor is used, the length of that resistor is shortened so that the integrated area can be reduced. Its example will be described with reference to FIG. 3.

Figure 3:
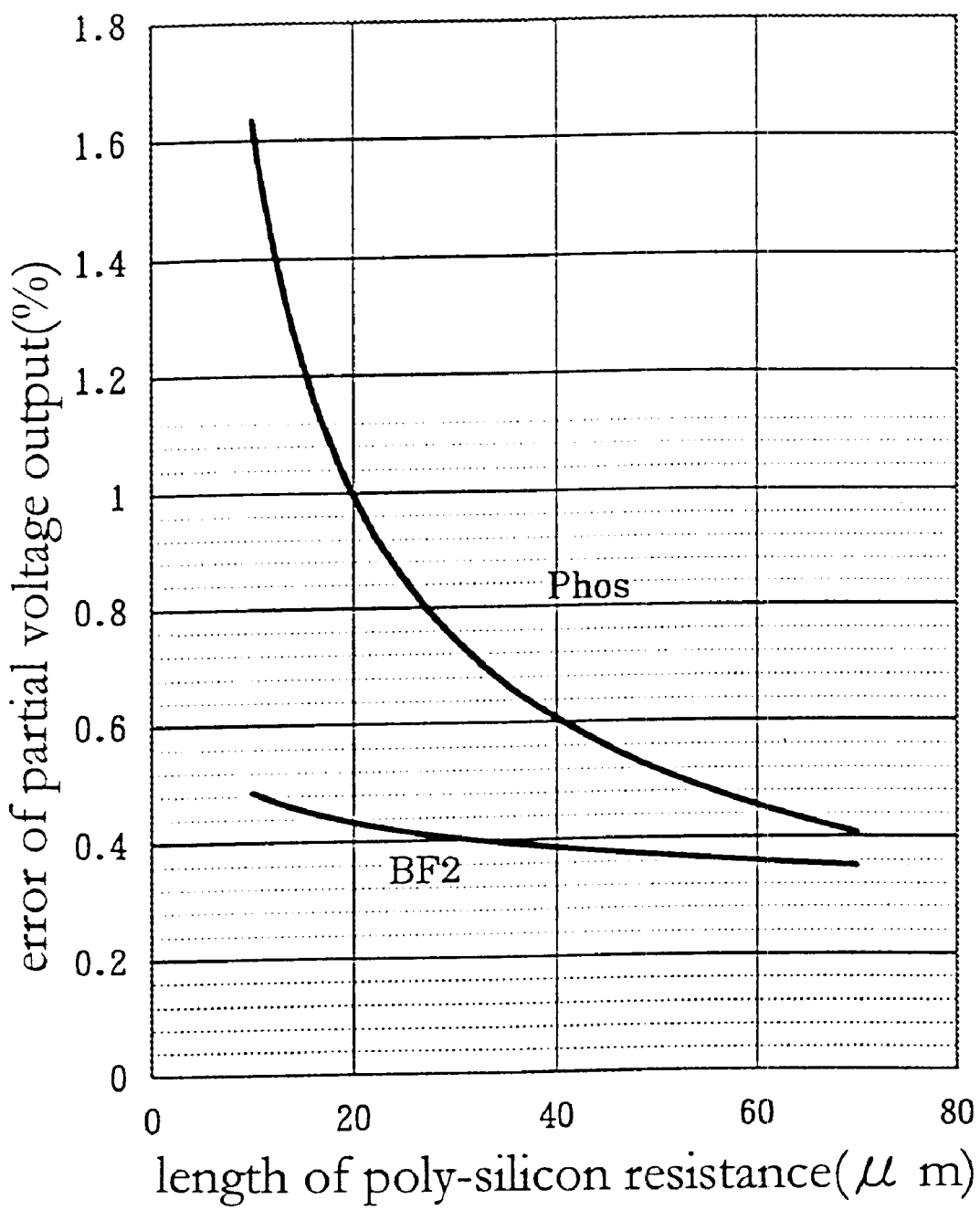
FIG. 3 is a graph showing a relation between the lengths of polycrystal silicon resistors 1000 Å in film thickness into which $BF_2$ is introduced in the p-type and phosphorus is introduced in the n-type, and the divided voltage output voltage error of the ladder resistor circuit made up of the respective polycrystal silicon resistors.

FIG. 3 is a graph showing a relation between the lengths of the p-type and n-type polycrystal silicon resistors each constituting a ladder circuit with 1000 Å of film thickness and 10 kΩ/□ in sheet resistance and the divided voltage output error. An example is shown in which $BF_2$ ions are used as the p-type impurities introduced into the p-type polycrystal silicon resistor, and phosphorus is used as the n-type impurities introduced into the n-type polycrystal silicon resistor.

As is apparent from FIG. 3, the film thickness of the polycrystal silicon film of the ladder circuit made up of the n-type polycrystal silicon resistor is thinned to 1000 Å, if the length of the polycrystal silicon resistor becomes 30 μm or less, the divided voltage output error of 0.5% or less cannot be ensured. However, the ladder circuit made up of the p-type polycrystal silicon resistor can ensure the divided voltage output error of 0.5% or less even if the length of the polycrystal silicon resistor is 10 μm. In addition, for the above reason, if the film thickness of the polycrystal silicon film is further thinned, the divided voltage output error becomes small, which is effective. However, as the film thickness of the polycrystal silicon film is thinned, the variation in the film thickness within the substrate and between the substrates increases, as a result of which the variation in the resistance increases. Accordingly, the divided voltage output error becomes large. For that reason, the film thickness is desirably 500 Å to 1500 Å, and its optimum value is 500 Å. Also, as the length of the polycrystal silicon resistor is shortened, an influence of the grain size cannot be ignored, thereby increasing the variation in the resistance. For that reason, since the divided voltage output error increases, it is desirable that the length of the polycrystal silicon resistor is 10 μm or more, and also since the integrated area is caused to increase, 150 μm is the limit of polycrystal silicon resistor length.

Figure 4:
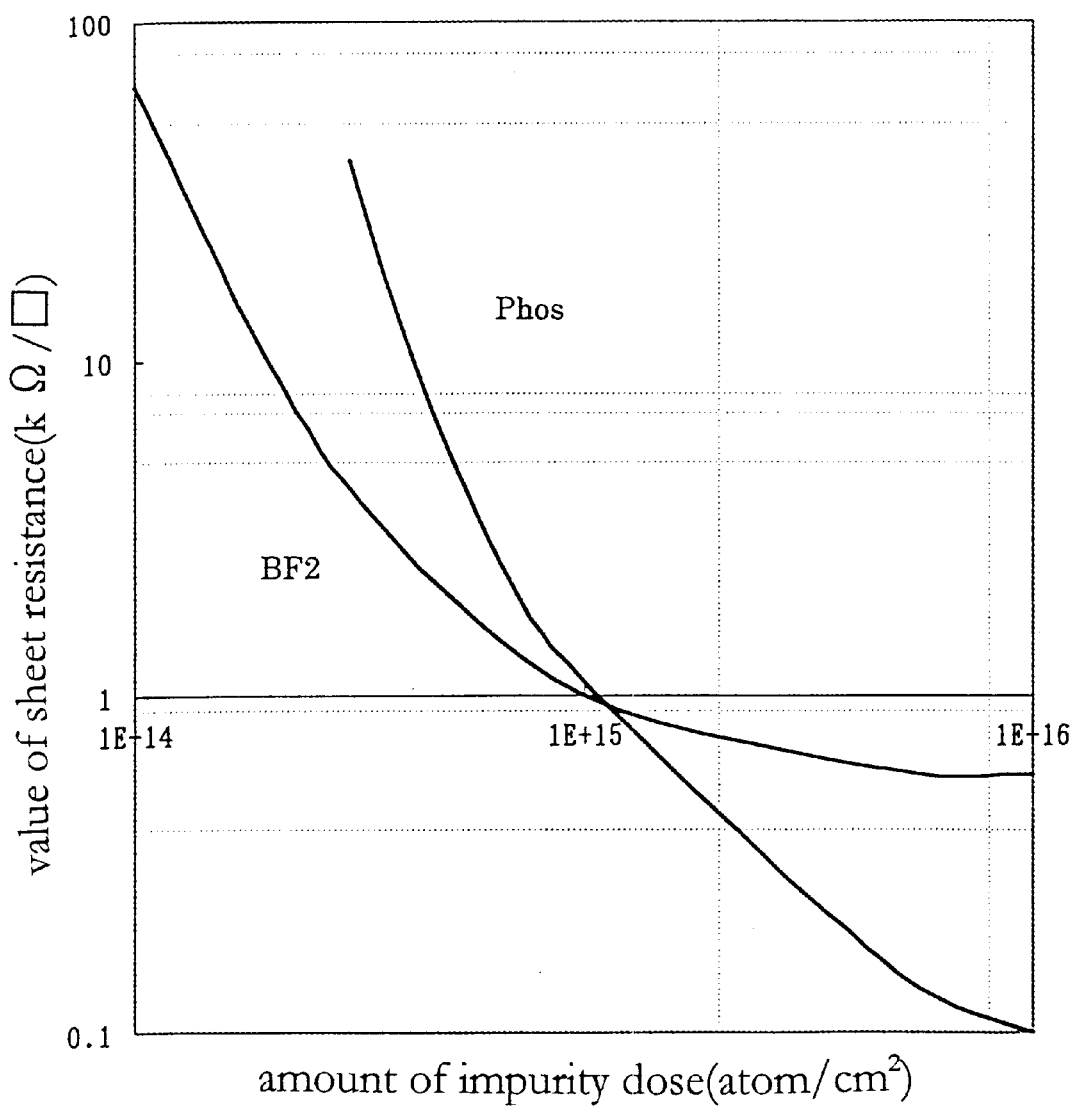
FIG. 4 is a graph showing a relation between the impurity dose amount and the sheet resistance when the impurities are introduced into the polycrystal silicon of 1000 Å in film thickness with the p-type impurities being $BF_2$ and the n-type impurities being phosphorus.

Further, FIG. 4 is a graph showing a relation between the impurity dose amount and the sheet resistance when the impurities are introduced into the polycrystal silicon of 1000 Å in film thickness through the ion implanting technique with the p-type impurities being $BF_2$ and the n-type impurities being phosphorus.

As is apparent from FIG. 4, if ions introduced into the polycrystal silicon are changed from phosphorus to $BF_2$, the variation of the low-concentration impurities is reduced.

An example will be described in which phosphorus and $BF_2$ are introduced into the polycrystal silicon to produce the sheet resistance of 20 kΩ/□. As usual, the impurity dose amount varies "10% of the introduced impurity dose amount. Since the dose amount necessary for producing the polycrystal silicon resistor of 20 kΩ/□ in sheet resistance by using phosphorus is $3.5 \times 10^{14}$ atom/cm$^2$, the dose amount varies to the degree of $\pm 0.35 \times 10^{14}$ atom/cm$^2$. That is, in the case where the polycrystal silicon resistor of 20 kΩ/□ in sheet resistance is to be produced by phosphorus, it is proved that the sheet resistance varies within the range of 13 kΩ/□ and 30 kΩ/□. Also, since the dose amount necessary for producing the polycrystal silicon resistor of 20 kΩ/□ in sheet resistance by using $BF_2$ is $1.35 \times 10^{14}$ atom/cm$^2$, the dose amount varies to the degree of $\pm 0.135 \times 10^{14}$ atom/cm$^2$. That is, in the case where the polycrystal silicon resistor of 20 kΩ/□ in sheet resistance is to be produced by $BF_2$, the sheet resistance varies within the range of 17 kΩ/□ and 25 kΩ/□. It is apparent from the above that $BF_2$ more reduces the variation in the concentration of the low concentration impurities as compared with phosphorus. As described above, if the variation in the concentration of the low concentration impurities is reduced, the divided voltage output error of the ladder circuit becomes small. That is, the ladder circuit made up of the p-type polycrystal silicon resistor can elevate the sheet resistance of the polycrystal silicon resistor while maintaining the divided voltage output error to 0.5% or less.

Also, in order to reduce the divided voltage output error of the ladder circuit formed of the polycrystal silicon film and decrease the area in the integrated circuit such as a switching regulator (hereinafter referred to as SWR), it is formed of the n-type polycrystal silicon resistor, the sheet resistance of which is normally about 5 kΩ/□ to 25 kΩ/□. However, because a variation in the resistance to the temperature is about −2700 ppm/° C. to −4800 ppm/° C., if such a resistor is used for a constant-current section that sets the oscillation frequency of the SWR, the oscillation frequency is caused to fluctuate between −40° C. and 85° C. which are in an applied temperature range. However, the variation in the resistance to the temperature of the polycrystal silicon resistor which is of the p-type conductive type and about 5 kΩ/□ to 25 kΩ/□ in sheet resistance is about −1700 ppm/° C. to −4000 ppm/° C. Thus, the variation in resistance is smaller than that of the n-type polycrystal silicon resistor with the result that the oscillation frequency fluctuation can be reduced.

Figure 5:
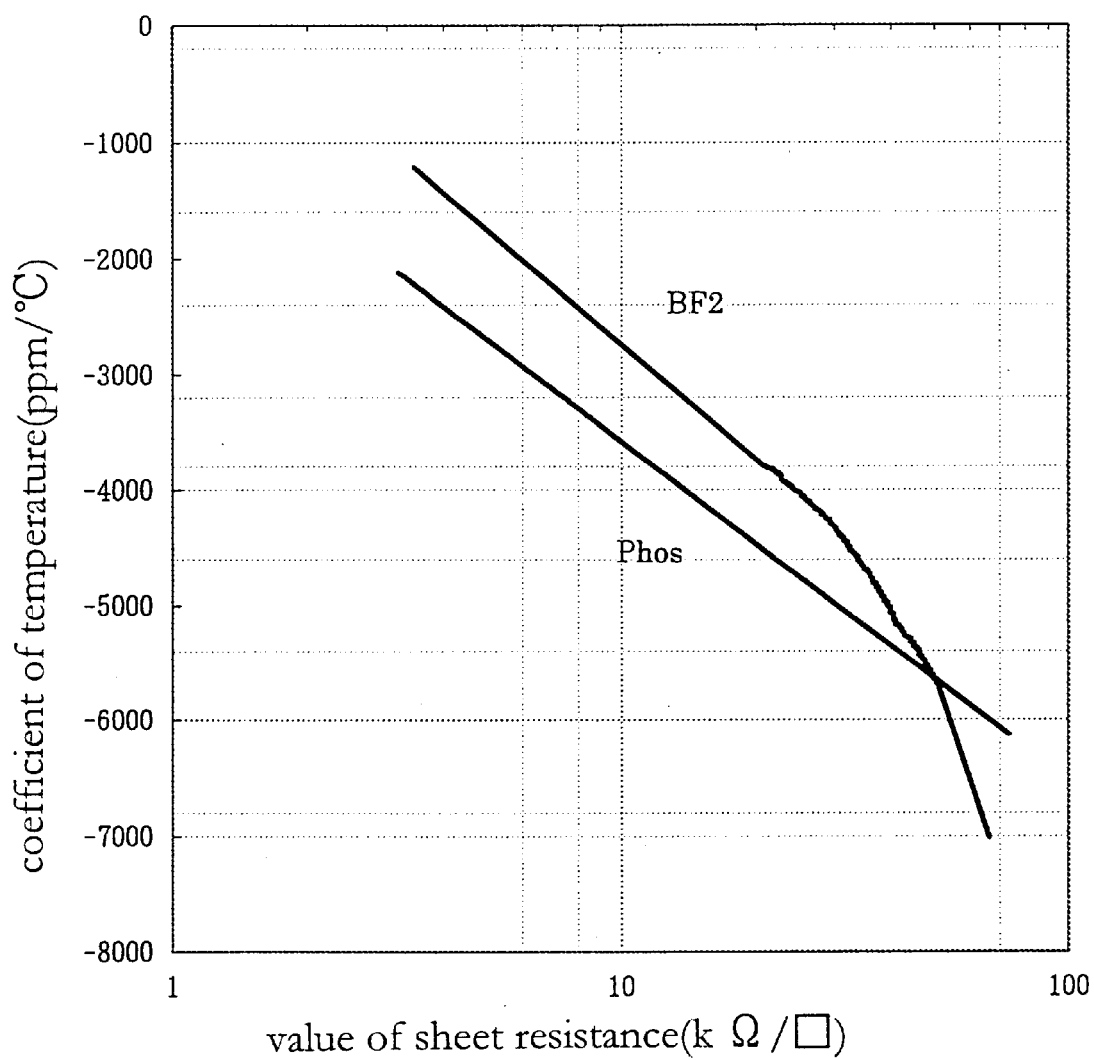
FIG. 5 is a diagram showing a relation between the sheet resistance and the temperature coefficient when $BF_2$ is used as the p-type impurities and phosphorus is used as the n-type impurities in the polycrystal silicon of 1000 Å in film thickness.

FIG. 5 is a diagram showing a relation between the sheet resistance and the temperature coefficient when $BF_2$ is used as the p-type impurities and phosphorus is used as the n-type impurities in the polycrystal silicon of 1000 Å in film thickness, and shows that the variation in resistance to the temperature of the p-type polycrystal silicon resistor is smaller than that of the n-type polycrystal silicon resistor.

As the sheet resistance increases, the variation in the concentration of the low-concentration impurities increases, thereby making the divided voltage output error increase as described above. In addition, because the variation in the resistance to the temperature is caused to increase, it is desirable that the sheet resistance is 25 kΩ/□ or less. Also, since the variation in the grain size cannot be ignored if the resistance is small, it is desirable that the sheet resistance is 1 kΩ/□ or more. In other words, it is desirable that the sheet resistance of the p-type polycrystal silicon resistor is 1 kΩ/□ to 25 kΩ/□ and the variation in the resistance to the temperature of the p-type polycrystal silicon resistor at that time is −4000 ppm/° C. or less.

Figure 2:
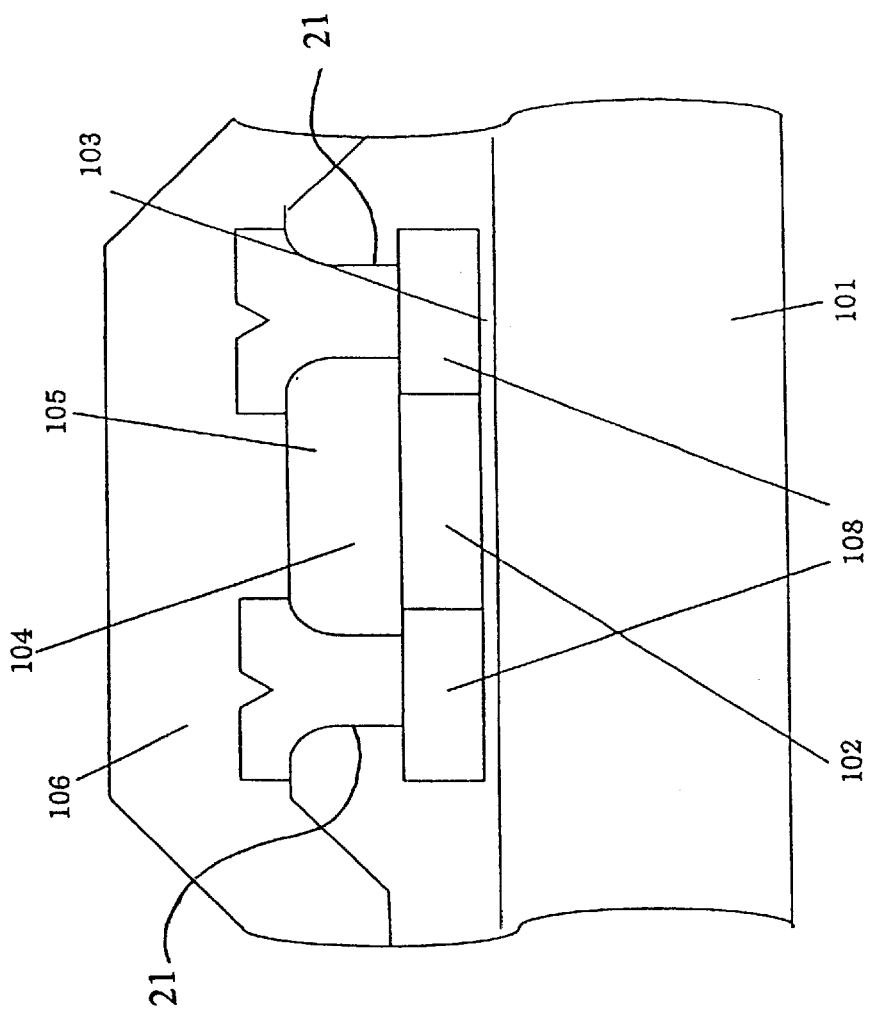
FIG. 2 is a schematic sectional view showing a resistor element of a semiconductor device according to the present invention shown in FIG. 1.

FIG. 2 is a schematic sectional view showing one embodiment of a semiconductor device manufactured through the manufacturing method according to the present invention.

In FIG. 2 showing the sectional view of the resistant element used in the ladder resistor circuit of the present invention, a high-resistant polycrystal silicon resistor 102 in the low-concentration impurity region into which $BF_2$ or as p-type impurities is introduced is formed on a silicon semiconductor substrate 101 through a field oxide film 103. It is assumed that the film thickness of the polycrystal silicon film is 500 Å TO 1500 Å. Further, a p-type high-concentration region 108 in which the concentration of the impurities is heightened so as to obtain sufficient contact with an aluminum wiring 105 is provided on both ends of the above resistor. On the high-concentration region, a metal electrode 105 is disposed through the contact hole 21 in an intermediate insulation film 104, on which a protective film 106 is disposed.

FIG. 6 is a sectional view showing a process procedure of the manufacturing method shown in FIG. 2 in accordance with the present invention. FIG. 6a shows an appearance in which the oxide film 103 is formed on the surface of the silicon substrate 11, the polycrystal silicon film 102 is coated on the oxide film 103 through the CVD method (Chemical Vapor Deposition) or the sputtering method, and $BF_2$ which is the p-type impurities is introduced so as to obtain a desired sheet resistance through the ion implantation method. The polycrystal silicon film 102 is set at 500 Å to 1500 Å in film thickness, and the p-type impurities $BF_2$ are introduced in the polycrystal silicon film 102 so as to obtain the sheet resistance of 1 kΩ/□ to 25 kΩ/□. The p-type impurities introduced into the polycrystal silicon resistor 102 may be boron. For example, in the present invention, the polycrystal silicon film is 1000 Å in film thickness, and doped with $BF_2$ of about $1 \times 10^{14}$ to $1 \times 10^{15}$ atom/cm$^2$ which is the p-type impurities to obtain the sheet resistance of 1 kΩ/□ to 25 kΩ/□.

Figure 6A:
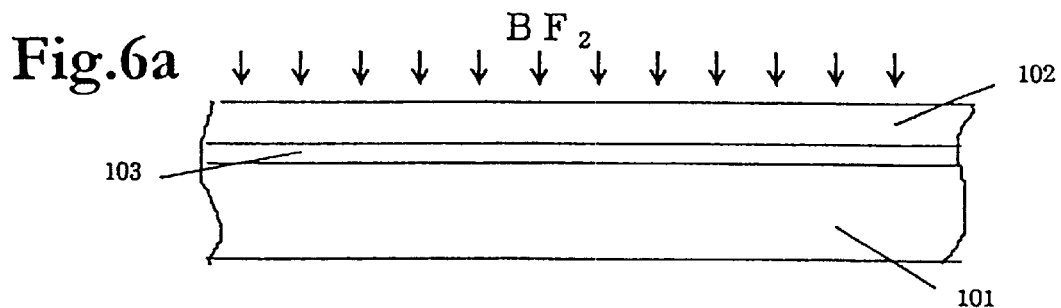
FIG. 6 is a sectional view showing a process procedure of the method of manufacturing the resistor element in the semiconductor device of the present invention as shown in FIG. 1.
Figure 6B:
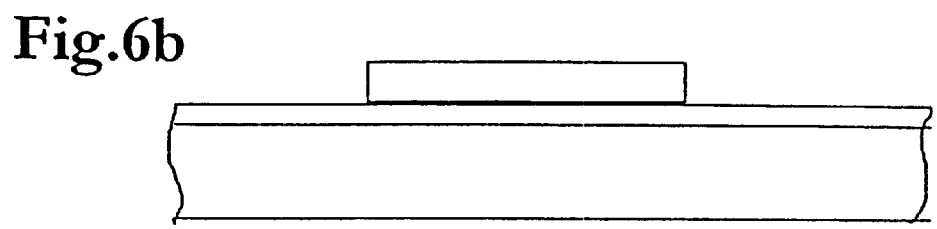

FIG. 6b shows an appearance in which the polycrystal silicon resistor 102 is patterned through the photolithography method and the dry etching method. At this time, it is necessary that the length of the polycrystal silicon resistor is 10 μm to 150 μm.

Figure 6C:
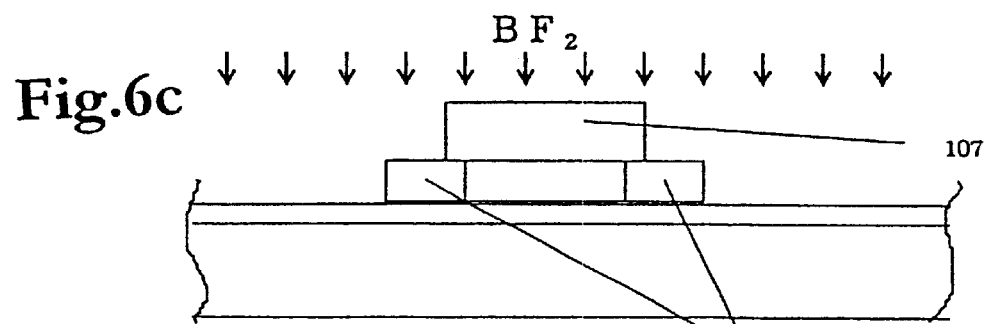

FIG. 6c shows an appearance in which the photoresist 107 is patterned on the polycrystal silicon resistor 102 through the photolithography method in such a manner that a region which becomes the high-impurity concentration region 108 is opened in order to obtain sufficient contact with the aluminum wiring, and $BF_2$ which is the p-type impurities is introduced with the dose amount of $1 \times 10^{15}$ to $5 \times 10^{16}$ atom/cm$^2$ through the ion implantation method. In the present invention, $BF_2$ which is the p-type impurities is introduced with the dose amount of $5 \times 10^{15}$ atom/cm$^2$ in the high-impurity concentration region in order to obtain sufficient contact with the aluminum wiring of the polycrystal silicon resistor.

Figure 6D:
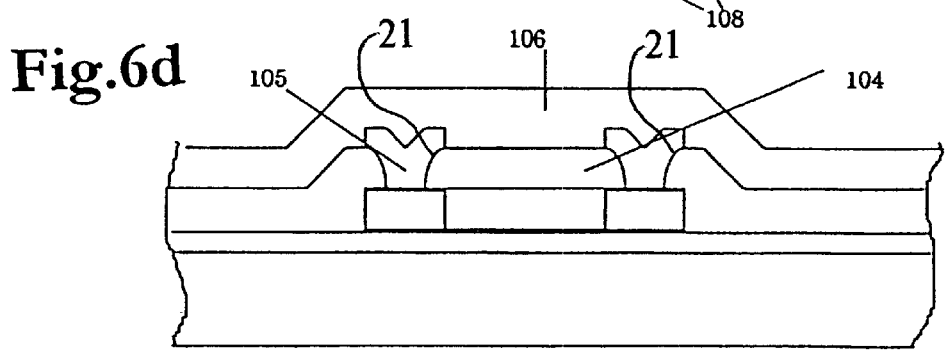

Thereafter, the photoresist 107 is removed, and the intermediate insulation film 104 is formed through the CVD method and flattened through a heat treatment. Then, a contact hole 21 that allows the intermediate insulation film 104 to selectively communicate with the high-impurity concentration region 108 of the polycrystal silicon resistor is formed. Subsequently, a contact flow process is conducted, and finally after a metal material or the like is wholly formed on the upper surface through vapor deposition, sputtering or the like, photolithography and etching are conducted to form the patterned metal wiring 105 so that the front surface of the semiconductor substrate is coated with the surface protective film 106. FIG. 6d shows an appearance of the p-type polycrystal silicon resistor 102 thus formed. The polycrystal silicon resistor that constitutes the components other than the ladder circuit may not always be made of the p-type polycrystal silicon. Taking the characteristics and the forming process into consideration, the type of polycrystal silicon may be selected. However, the p-type polycrystal silicon resistor is used on a portion requiring high accuracy.

Figure 7:
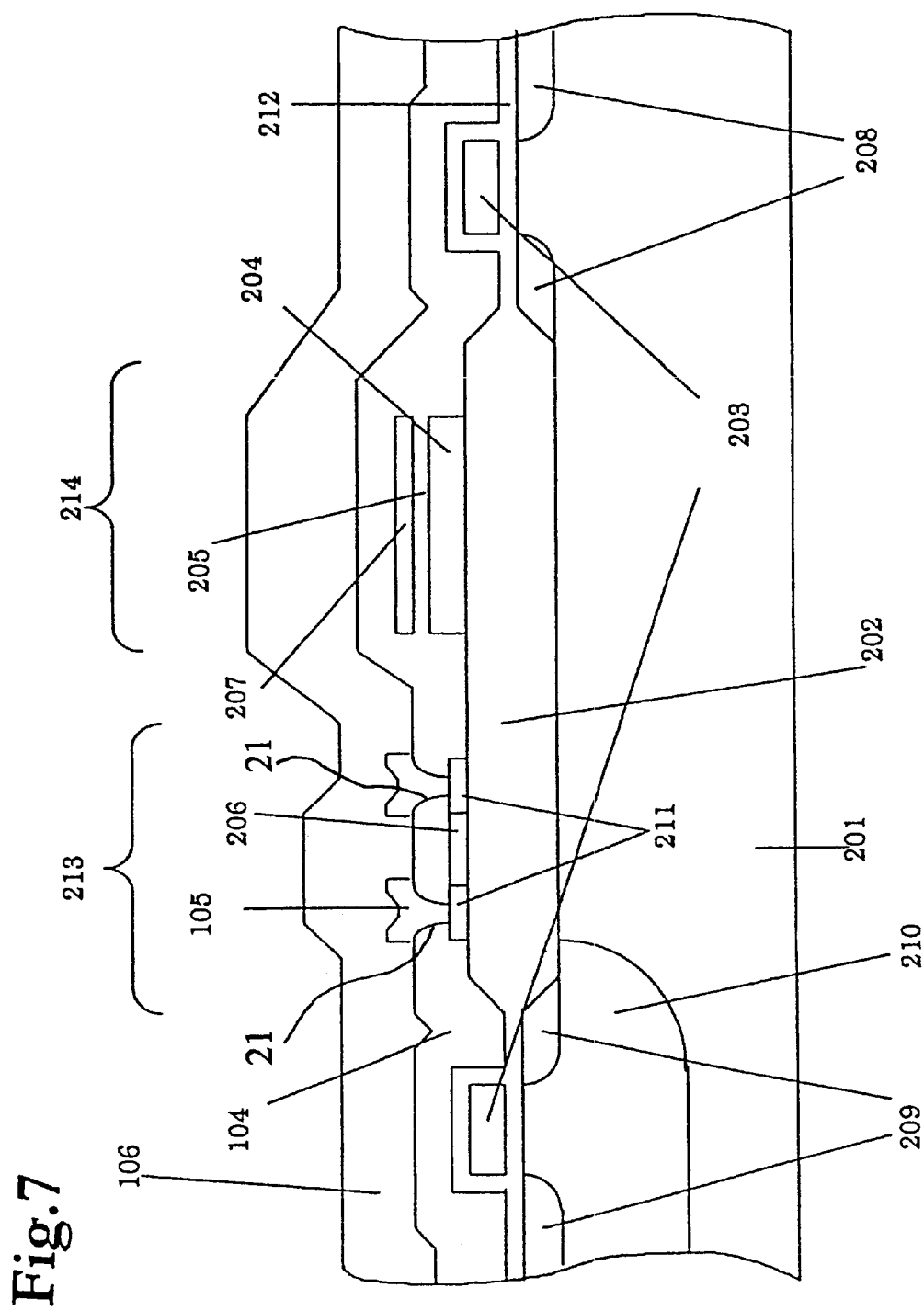
FIG. 7 is a cross-sectional view in the case where the present invention is applied to a semiconductor device including a MOS transistor and a capacitor.

Further, FIG. 7 is a cross-sectional view of the substrate in the case where the manufacturing method of the present invention is applied to the integrated circuit device including a MOS transistor and a capacitor. An n-type well region 210 which is opposite in conductivity to the p-type silicon semiconductor substrate is formed in a p-type silicon semiconductor substrate 201. Also, an n-type diffusion region 208 which is opposite in conductivity to the p-type silicon semiconductor substrate is formed on the p-type silicon semiconductor substrate 201, and a p-type diffusion region 209 which is opposite in conductivity to the well region is formed on the n-type well region 210, thus forming a MOS transistor having a gate electrode 203 consisting of the respective diffusion layers and the first polycrystal silicon film. It is not always necessary to use the p-type silicon semiconductor substrate. For example, the p-type well region is produced using the n-type silicon semiconductor substrate, the p-type transistor is produced in the n-type silicon semiconductor substrate, and the n-type transistor is produced in the p-type well region. Then, the first polycrystal silicon film constitutes the gate electrode 203 and is formed on a field oxide film 202 as a capacitor electrode 204. A capacitor electrode 207 formed of a second polycrystal silicon resistor into which $BF_2$ or boron is introduced is formed on the capacitor electrode 204 formed of the first polycrystal silicon film through an insulation film 205. Further, the second polycrystal silicon resistor forms a resistor 206 of the present invention which forms the capacitor electrode 207 and the ladder circuit. The gate electrode of FIG. 7 may be made of the second polycrystal silicon. Also, it is unnecessary to make the film thickness of the second polycrystal silicon equal to the film thickness of the first polycrystal silicon, and the resistance can be arbitrarily set by the film thickness of polycrystal silicon. For example, the film thickness of the first polycrystal silicon is set at 4000 Å, and the film thickness of the second polycrystal silicon is set at 1000 Å.

FIG. 8 is a sectional view showing a process procedure of the substrate in the case where the manufacturing method of the present invention is applied to the integrated circuit device including a MOS transistor and a capacitor.

Figure 8A:
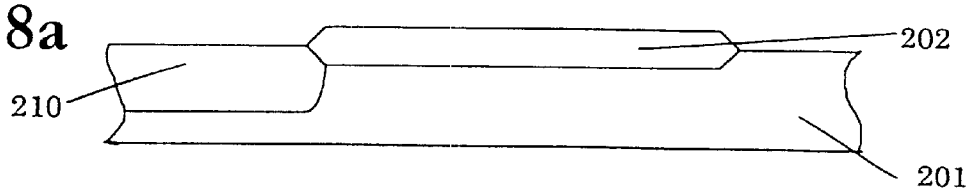
FIG. 8 is a sectional view showing a process procedure of the manufacturing method in the case where the present invention is applied to a semiconductor device including a MOS transistor and a capacitor.

FIG. 8a shows an appearance in which after a silicon nitride film ($Si_9N_4$) is patterned on the p-type semiconductor substrate 201 so as to open the n-type well region 210 which is opposite in conductivity to the p-type semiconductor substrate, the surface is doped with phosphorus which is the n-type impurities through the ion implantation method, thus removing the silicon nitride film. Then, the figure shows an appearance in which a separation region and an active region are formed through the Locos method.

Figure 8B:
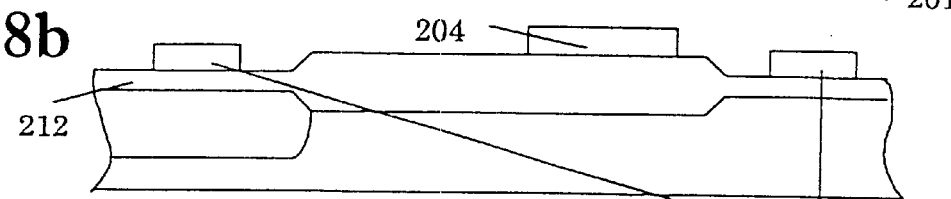

In FIG. 8b, after the gate insulation film having, for example, a thickness of 300 Å, has been formed through the thermal oxidizing method, the first polycrystal silicon film which will form the gate electrode 203 and the capacitor electrode 204 is coated on the oxide film through the CVD method or the sputtering method, and doped with phosphorus of high concentration through the ion implantation method or in an impurity diffusion furnace. FIG. 8b shows an appearance in which the gate electrode 203 and the first polycrystal silicon resistor as the capacitor electrode 204 are patterned through the photolithography technique and the dry etching method.

As usual, in order to ensure the reliability of the semiconductor device, it is necessary to set the film thickness of the gate insulation film at about 3 MV/cm. For example, in case of a MOS transistor, the power voltage of which is 30 V, the oxide film of 1000 Å or more in film thickness is required.

Figure 8C:
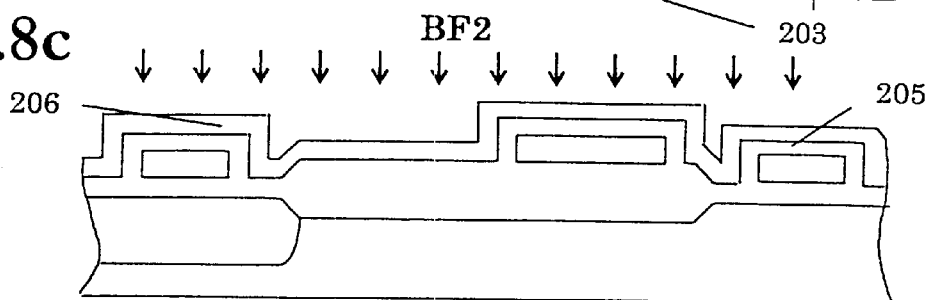

FIG. 8c shows an appearance in which the oxide film 205 which is 100 Å to 300 Å in film thickness is formed on the first polycrystal silicon film, a second polycrystal silicon which will form a second polycrystal silicon resistor 206 and the capacitor electrode 207 is coated on the upper surface through the CVD method or the sputtering method, and doped with $BF_2$ which is the p-type impurities through the ion implantation method. The second polycrystal silicon film is 500 Å to 1500 Å in film thickness and is doped with the p-type impurities of $BF_2$ to obtain the sheet resistance of 1 kΩ/□ to 25 kΩ/□. The p-type impurities introduced into the polycrystal silicon resistor may be boron. Also, the insulation film 205 on the first polycrystal silicon film as the capacitor electrode 204 may be an insulation film which is a laminated structure consisting of, for example, a thermal oxide film (Bottom.Ox) of 300 Å in film thickness, a nitride film 500 Å in film thickness produced through the CVD method and a thermal oxide film (Top. Ox) of about 10 Å in film thickness, for the purpose of forming a high-quality capacitor, other than the thermal oxide film. Also, the film thickness of the Bottom. Ox is set at about 300 Å to 700 Å, the film thickness of the nitride film is set at about 200 Å to 1000 Å, and the film thickness of the Top. Ox is set at 100 Å or less. It is preferable that the film thickness of the Bottom. Ox and the nitride film is determined according to a required breakdown field.

Figure 8D:
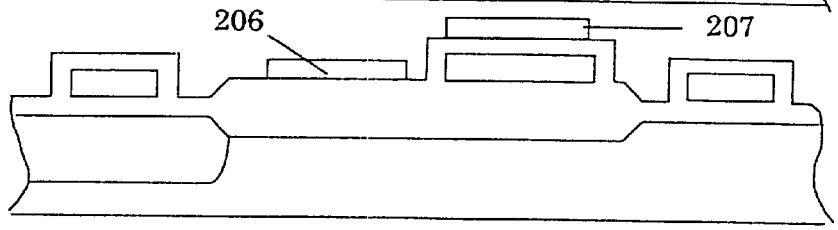

FIG. 8d shows an appearance in which the second polycrystal silicon resistors 206 and 207 are patterned through the photolithography method and the dry etching method. At this time, it is necessary that the length of the polycrystal silicon resistor is 10 μm to 150 μm.

Figure 8E:
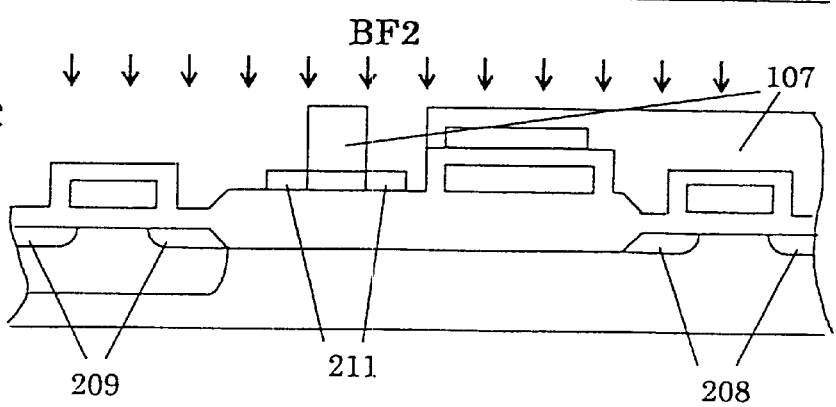

FIG. 8e shows an appearance in which the photoresist is patterned through the photolithography method in such a manner that a region which becomes the diffusion region 208 of the n-type transistor is opened, and after arsenic which is the n-type impurities is introduced with the dose amount of $3\times10^{15}$ to $5\times10^{19}$ atom/cm$^2$ through the ion implantation method, a high-temperature heat treatment is conducted to activate and diffuse the implanted impurities. Then, the photoresist 107 is patterned on the polycrystal silicon resistor through the photolithography method in such a manner that a region which will form a p-type high-impurity concentration region 211 and a region which will form the diffusion region 209 of the p-type transistor are opened in order to obtain sufficient contact with an aluminum wiring, thus introducing BF$_2$ of the p-type impurities through the ion implantation method. In the present invention, BF$_2$ which is the p-type impurities is introduced with the dose amount of $5\times10^{15}$ atom/cm$^2$ in the high-impurity concentration region 211 in order to obtain sufficient contact with the aluminum wiring of the polycrystal silicon resistor.

Thereafter, the photoresist is removed, and the intermediate insulation film 104 is formed through the CVD method or the like, and flattened through a heat treatment. Then, a contact hole 21 that allows the intermediate insulation film 104 to selectively communicate with the high-impurity concentration region 211 of the polycrystal silicon resistor is formed. Subsequently, a contact flow process is conducted, and finally after a metal material or the like is wholly formed on the upper surface through vapor deposition, sputtering or the like, photolithography and etching are conducted to form the patterned metal wiring 105 so that the front surface of the semiconductor substrate is coated with the protective film 106. FIG. 7 shows an appearance of the p-type polycrystal silicon resistor thus formed.

The gate electrode shown in FIG. 8c may be made of the second polycrystal silicon. Also, it is unnecessary to make the second polycrystal silicon equal in film thickness to the first polycrystal silicon, and the resistance can be arbitrarily set according to the film thickness of the polycrystal silicon. For example, the film thickness of the first polycrystal silicon may be set at 4000 Å, and the film thickness of the second polycrystal silicon may be set at 1000 Å.

Figure 9A:
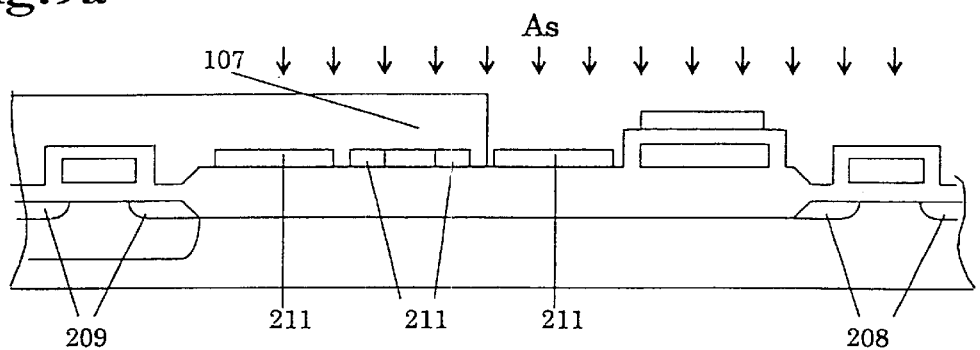
FIG. 9 is a sectional view showing a process procedure of a manufacturing method in the case where the present invention is applied to a semiconductor device including a polycrystal silicon resistor that constitutes a component other than the ladder circuit, a MOS transistor and a capacitor.

FIG. 9 is a sectional view showing a process procedure of the substrate in the case where the manufacturing method of the present invention is applied to the integrated circuit device including a resistor element other than a MOS transistor a capacitor, and a ladder circuit. The processes up to FIG. 8d are identical, and the photoresist is patterned through the photolithography method in such a manner that a region which will form the diffusion region 208 of the n-type transistor and a region which will form an n-type polycrystal silicon resistor 216 are opened, and after arsenic which is the n-type impurities is introduced with the dose amount of $3\times10^{15}$ to $5\times10^{19}$ atom/cm$^2$ through the ion implantation method, a high-temperature heat treatment is conducted to activate and diffuse the implanted impurities.

Figure 9B:
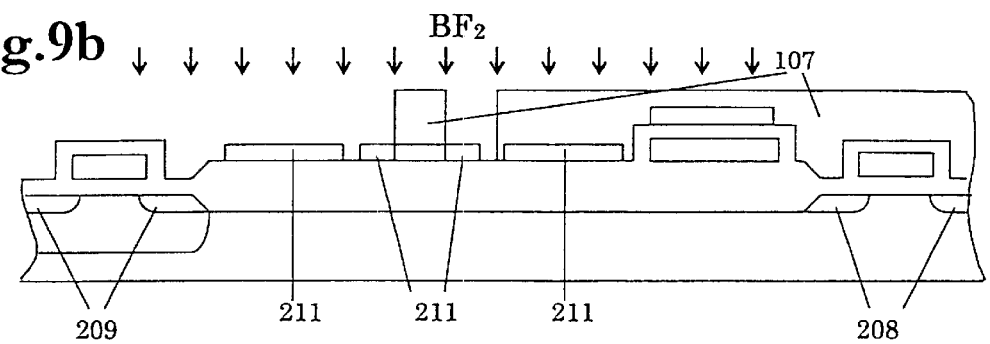

Then, as shown in FIG. 9(B), the photoresist 107 is patterned on the polycrystal silicon resistor through the photolithography method in such a manner that a region which will form the p-type high-impurity concentration region 211 and a region which will form the diffusion region 209 of the p-type transistor are opened in order to obtain sufficient contact with an aluminum wiring, thus introducing BF$_2$ of the p-type impurities through the ion implantation method. In the present invention, BF$_2$ which is the p-type impurities is introduced with the dose amount of $5\times10^{15}$ atom/cm$^2$ in the high-impurity concentration region 211 in order to obtain sufficient contact with the aluminum wiring of the polycrystal silicon resistor.

Figure 10:
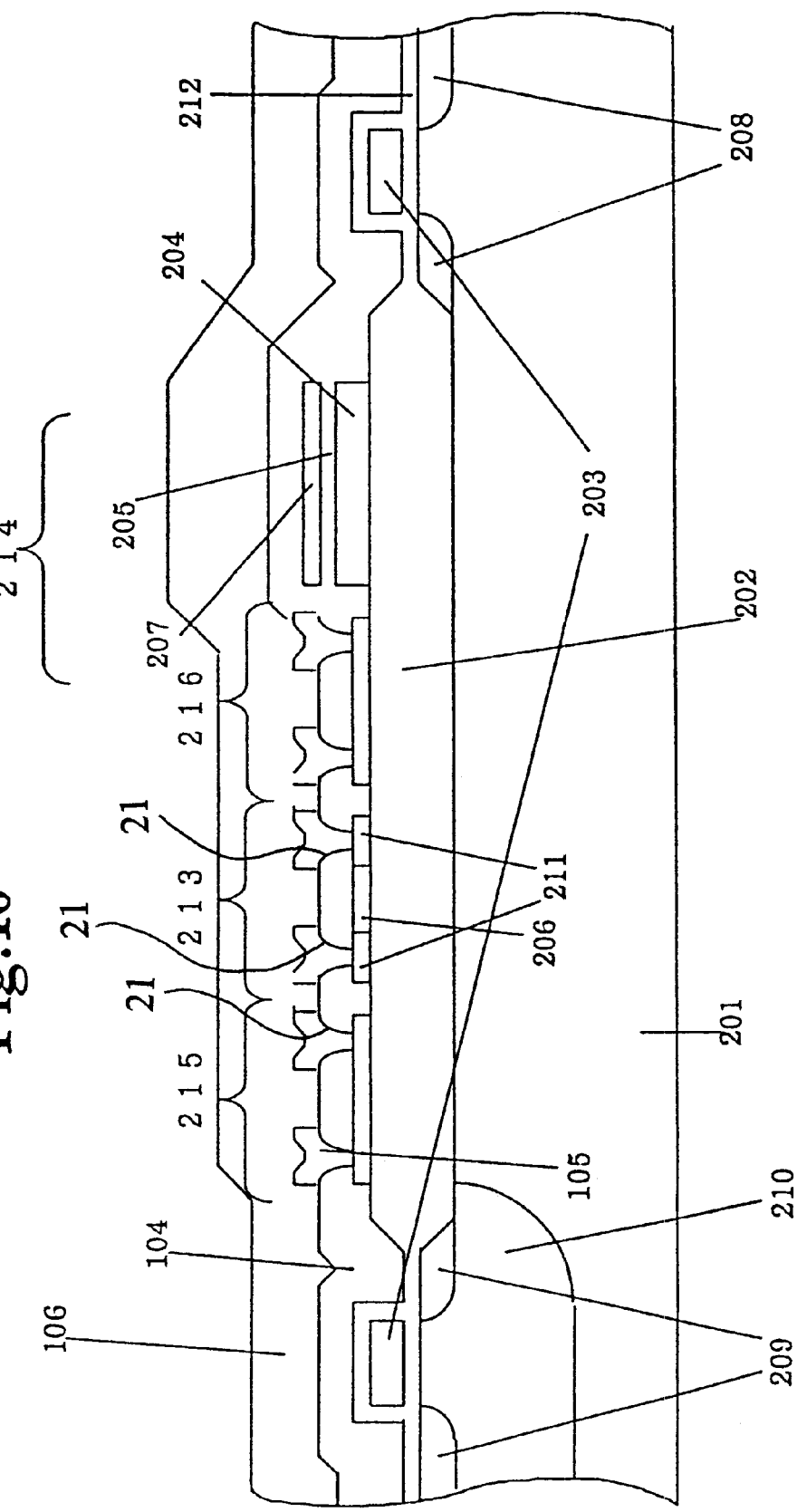
FIG. 10 is a process diagram showing a completed product state in the case where the present invention is applied to a semiconductor device including a polycrystal silicon resistor that constitutes a component other than the ladder circuit, a MOS transistor and a capacitor.

Thereafter, the photoresist is removed, and the intermediate insulation film 104 is formed through the CVD method or the like, and flattened through a heat treatment. Then, a contact hole 21 that allows the intermediate insulation film 104 to selectively communicate with the high-impurity concentration region 211 of the polycrystal silicon resistor is formed. Subsequently, a contact flow process is conducted, and finally after a metal material or the like is wholly formed on the upper surface through vapor deposition, sputtering or the like, photolithography and etching are conducted to form the patterned metal wiring 105 so that the front surface of the semiconductor substrate is coated with the protective film 106. FIG. 10 shows an appearance of three kinds of polycrystal silicon resistor thus formed which are different in sheet resistance.

It should be noted the polycrystal silicon resistors 213, 215 and 216 constituting the ladder circuit may be used for the polycrystal silicon resistor that constitutes a component other than the ladder circuit. Also, in order to obtain the polycrystal silicon resistor that constitutes a component other than the ladder circuit as a high resistor, Ar is ion-implanted with the dose amount of 1E14 to 1E16 atom/cm$^2$ subsequent to FIG. 8d. The following precesses are identical with FIGS. 9(A), 9(B) and FIG. 10 in the stated order. The ion-implantation of Ar damages the polycrystal silicon film, and the grain size becomes small with the result that the grain boundaries increase. For that reason, the sheet resistance of the n-type polycrystal silicon resistor into which n-type ions segregated by the grain boundaries are implanted is heightened, but the sheet resistance of the p-type polycrystal silicon resistor into which p-type ions not segregated by the grain boundaries are implanted is not changed. In this way, the sheet resistance of the n-type polycrystal silicon resistor can be changed by changing the doze amount of Ar which is ion-implanted.

As described above, according to the present invention, since the p-type impurities are introduced into the polycrystal silicon resistor in the ladder resistor circuit using the polycrystal silicon resistor, the sheet resistance is higher as compared with the prior art, the length is shortened, and a state in which the temperature coefficient is small can be produced. As a result, the ladder resistor circuit which is short in the length of the resistor and small in the divided voltage output error can be obtained which could not be obtained by the conventional ladder resistor circuit using the n-type polycrystal silicon resistor. Consequently, a high-accuracy ladder resistor circuit can be realized with a small occupied area, the costs can be reduced and the ladder resistor circuit is applicable to an IC, the chip size of which is restricted. Thus, great advantages can be obtained in many ICs.

What is claimed is:

1. A semiconductor device comprising: a ladder resistor circuit formed of a polycrystal silicon film having a thickness of 500–1500 Å and a sheet resistance of 1–5 kΩ/□, the polycrystal silicon film being doped only with p-type impurities.

2. A semiconductor device as claimed in claim 1; wherein the p-type impurities comprise BF$_2$.

3. A semiconductor device as claimed in claim 1; wherein the p-type impurities comprise boron.

4. A semiconductor device as claimed in claim 1; wherein the ladder resistor circuit has a temperature coefficient of −4000 ppm/° C. or lower.

5. A semiconductor device as claimed in claim 1; wherein the ladder resistor circuit has a length of from 10 μm to 150 μm.

* * * * *